US012628602B2

(12) United States Patent
Wang et al.

(10) Patent No.: US 12,628,602 B2
(45) Date of Patent: May 12, 2026

(54) SUBSTRATE PROCESSING METHOD AND SUBSTRATE PROCESSING APPARATUS

(71) Applicant: SCREEN Holdings Co., Ltd., Kyoto (JP)

(72) Inventors: Zhida Wang, Kyoto (JP); Koji Ando, Kyoto (JP); Noritake Sumi, Kyoto (JP); Chiaki Moriya, Kyoto (JP); Daiki Uehara, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 851 days.

(21) Appl. No.: 17/894,148

(22) Filed: Aug. 23, 2022

(65) Prior Publication Data

US 2023/0066729 A1 Mar. 2, 2023

(30) Foreign Application Priority Data

Sep. 2, 2021 (JP) ................................. 2021-142952

(51) Int. Cl.
H01L 21/67 (2006.01)
C23C 16/455 (2006.01)
H01L 21/02 (2006.01)
(52) U.S. Cl.
CPC .. H01L 21/67034 (2013.01); C23C 16/45502 (2013.01); C23C 16/45557 (2013.01); H01L 21/02101 (2013.01)
(58) Field of Classification Search
CPC ......... H01L 21/67034; H01L 21/02101; C23C 16/45502

(Continued)

(56) References Cited

U.S. PATENT DOCUMENTS 5,417,768 A * 5/1995 Smith, Jr. .......... B01D 11/0261
134/30
6,612,317 B2 9/2003 Costantini et al. ......... 134/58 R
(Continued)

FOREIGN PATENT DOCUMENTS

CN 115732357 A * 3/2023 ....... H01L 21/02101
JP 63-179530 A 7/1988
(Continued)

OTHER PUBLICATIONS

Taiwanese Notice of Allowance issued on Nov. 1, 2023 in corresponding Taiwanese Patent Application No. 111119780.
(Continued)

*Primary Examiner* — Stephen M Gravini
(74) *Attorney, Agent, or Firm* — OSTROLENK FABER LLP

(57) ABSTRACT

This invention relates to a substrate processing technique for performing a pressure increasing step, a pressure keeping step and a pressure reducing step in this order in a processing container. A flow rate of a processing fluid in a processing space is suppressed to a second flow rate lower than a first flow rate while maintaining the processing space at a first pressure between the pressure increasing step and the pressure keeping step or in an initial stage of the pressure keeping step. In this way, the mutual diffusion between the processing fluid and a liquid in the processing space is promoted. After this diffusion proceeds, the substrate is dried by the discharge of the processing fluid from the processing space.

9 Claims, 5 Drawing Sheets

(58) Field of Classification Search
USPC .......................................................... 34/413
See application file for complete search history.

(56) References Cited

U.S. PATENT DOCUMENTS

| | | | | |
|---|---|---|---|---|
| 8,393,091 | B2 * | 3/2013 | Kawamoto | H01L 21/67028 257/334 |
| 8,701,308 | B2 * | 4/2014 | Hiroshiro | H05B 3/0052 134/135 |
| 8,793,898 | B2 * | 8/2014 | Jeong | H01L 21/67051 134/32 |
| 9,275,847 | B2 * | 3/2016 | Jung | H01L 21/67051 |
| 9,587,880 | B2 * | 3/2017 | Kim | F26B 5/005 |
| 10,197,333 | B2 * | 2/2019 | Kim | F26B 3/04 |
| 10,504,718 | B2 * | 12/2019 | Ohno | H01L 21/67051 |
| 10,576,493 | B2 * | 3/2020 | Egashira | B05C 5/0225 |
| 10,801,777 | B2 * | 10/2020 | Che | F26B 25/006 |
| 12,159,784 | B2 * | 12/2024 | Yamaguchi | H01L 21/67126 |
| 2004/0025908 | A1 | 2/2004 | Douglas et al. | 134/56 R |
| 2004/0072706 | A1 | 4/2004 | Arena-Foster et al. | 510/175 |
| 2004/0131980 | A1 | 7/2004 | Hayasaki et al. | 430/322 |
| 2006/0194404 | A1 | 8/2006 | Dupont et al. | 438/397 |
| 2017/0250060 | A1 * | 8/2017 | Lubomirsky | H01J 37/3244 |
| 2018/0138060 | A1 | 5/2018 | Okamura et al. | |
| 2018/0264504 | A1 | 9/2018 | Egashira et al. | |
| 2020/0246723 | A1 | 8/2020 | Goshi | |
| 2021/0023582 | A1 | 1/2021 | Heo et al. | |
| 2023/0066729 | A1 * | 3/2023 | Wang | H01L 21/67126 |

FOREIGN PATENT DOCUMENTS

| | | | | | |
|---|---|---|---|---|---|
| JP | 2003-510801 | A | 3/2003 | | |
| JP | 2013-012538 | A | 1/2013 | | |
| JP | 2018082043 | A | 5/2018 | | |
| JP | 2018-152477 | A | 9/2018 | | |
| JP | 2020-170873 | A | 10/2020 | | |
| JP | 2023036123 | A | * 3/2023 | ....... | H01L 21/02057 |
| KR | 10-2020-0096872 | A | 8/2020 | | |
| KR | 10-2021-0091685 | A | 7/2021 | | |
| TW | 200405456 | A | 4/2004 | | |
| TW | 200633016 | A | 9/2006 | | |
| TW | 200307973 | A | 12/2006 | | |
| WO | WO 01/22016 | A1 | 3/2001 | | |

OTHER PUBLICATIONS

Office Action dated Apr. 30, 2025 issued in corresponding Japanese Patent Application No. 2021-142952 and its English translation.
Office Action issued on Jan. 19, 2024 in corresponding Korean Patent Application No. 10-2022-0066211.
Office Action issued Jun. 5, 2025 for corresponding Patent Application No. 202210963352.1 and its English translation.
Notice of Allowance mailed Sep. 16, 2025, issued in corresponding Japanese Patent Application No. 2021-142952.

* cited by examiner

F I G.  1

F I G. 2 A
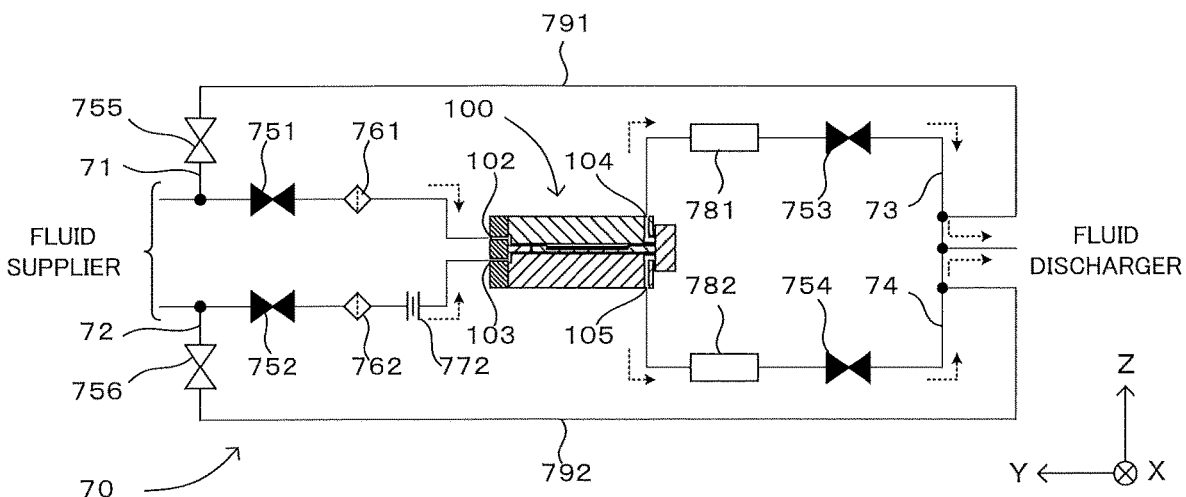
F I G. 2 B
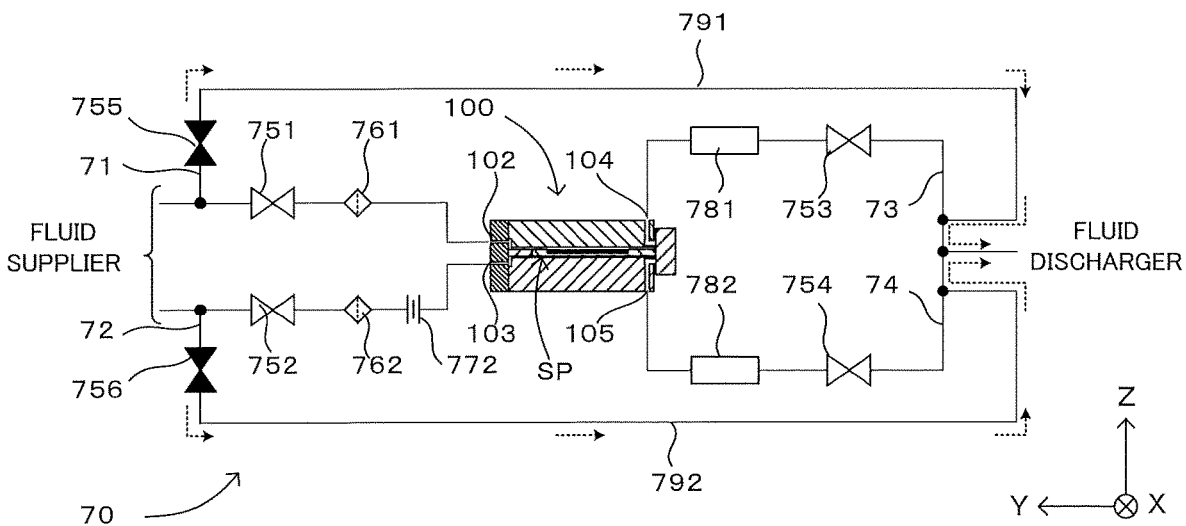

F I G. 3
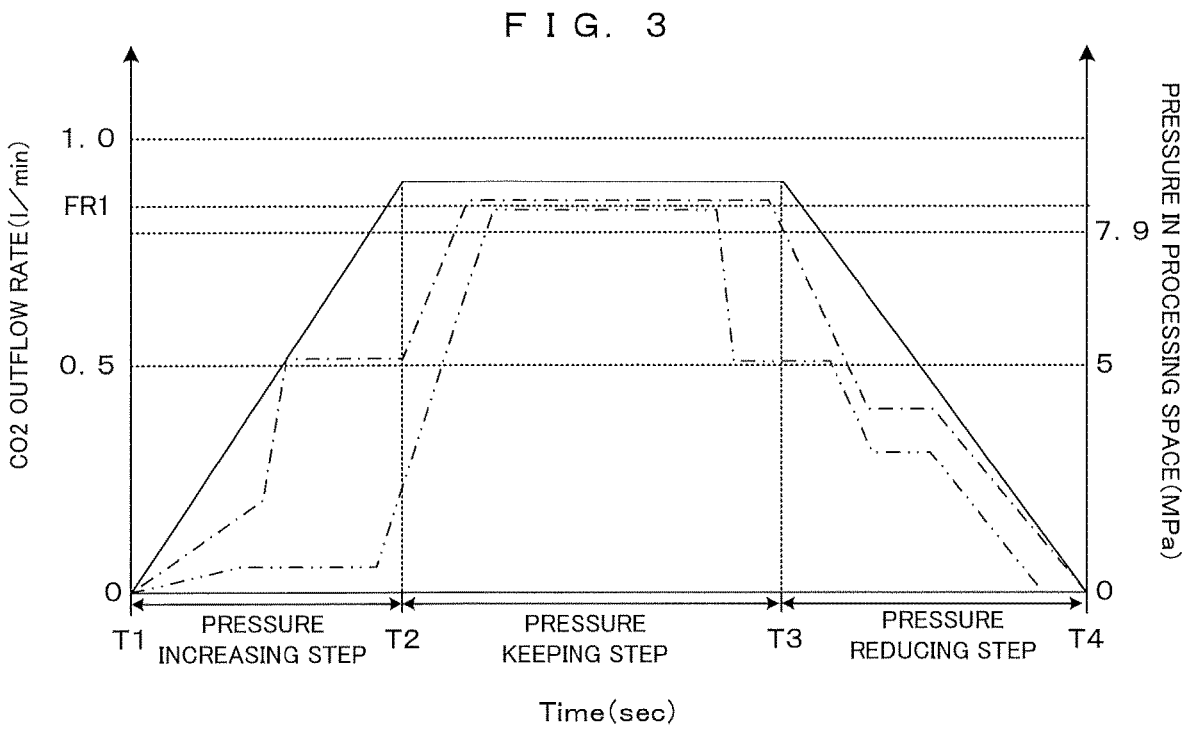
F I G. 4
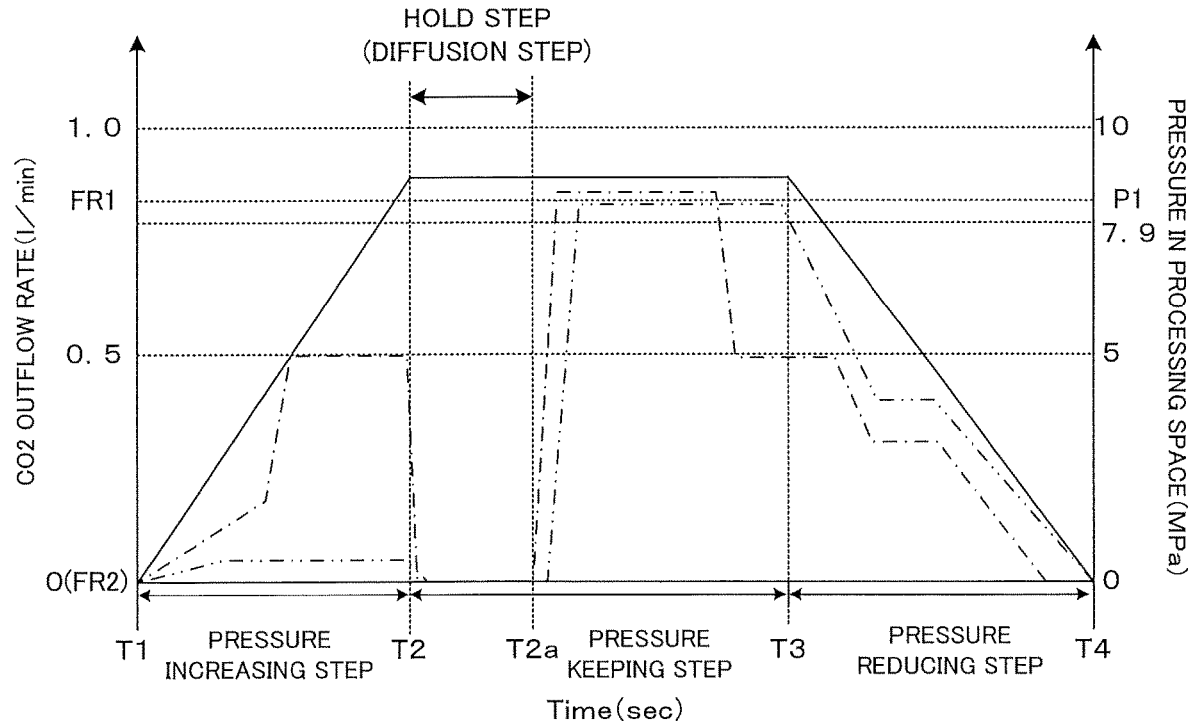

F I G. 5
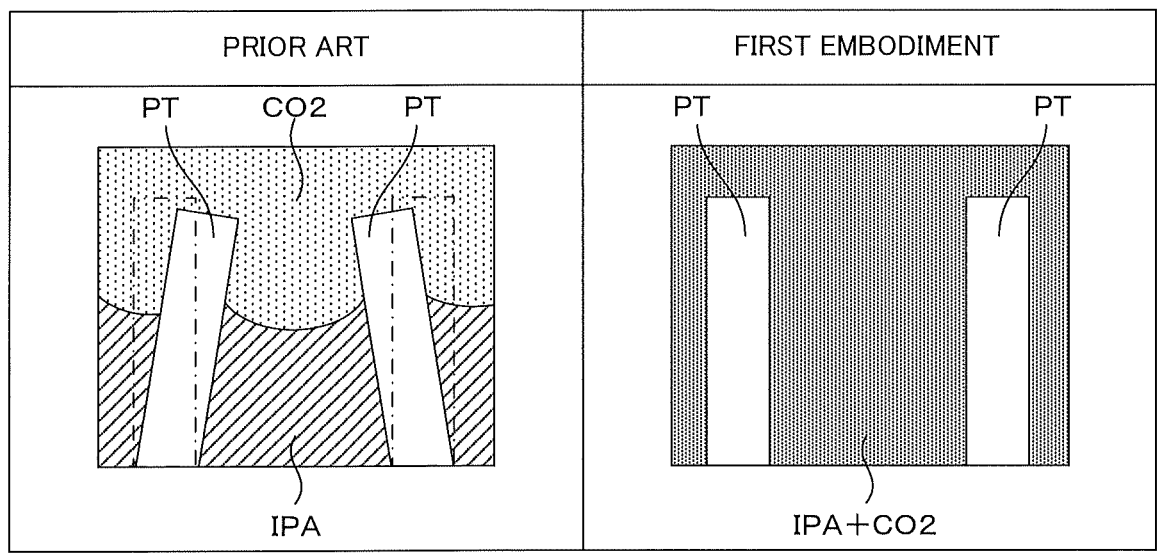

F I G. 6
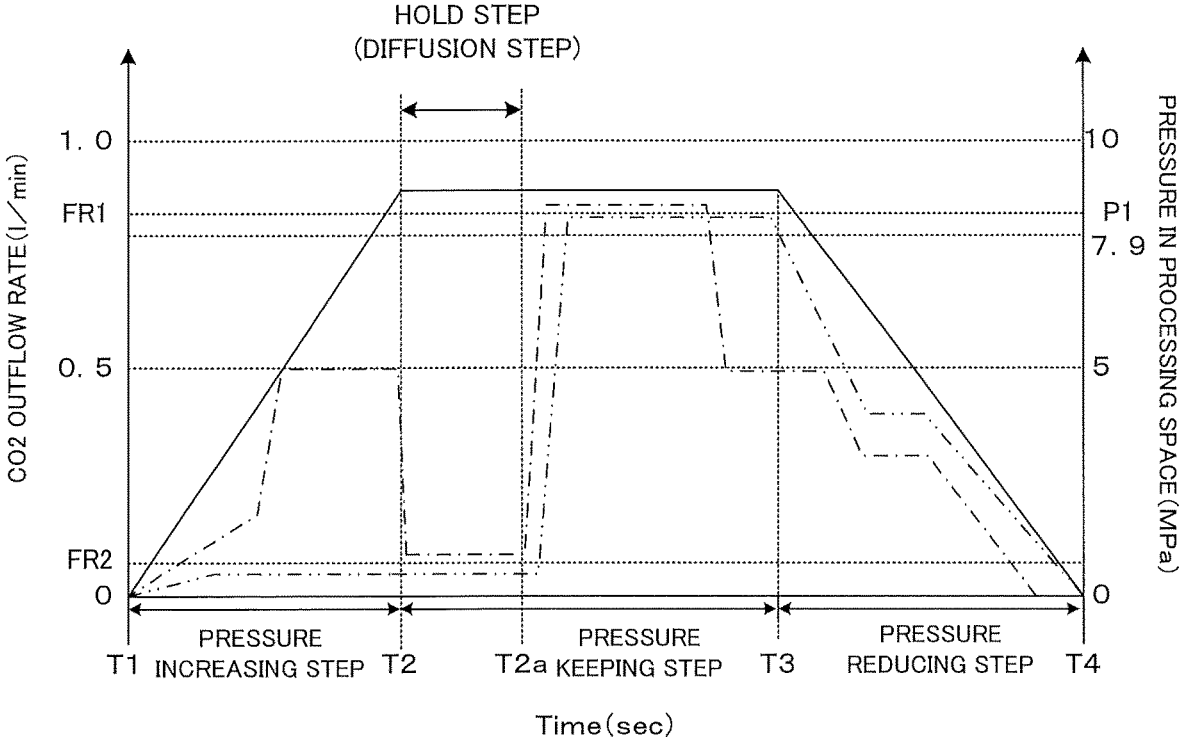
F I G 7
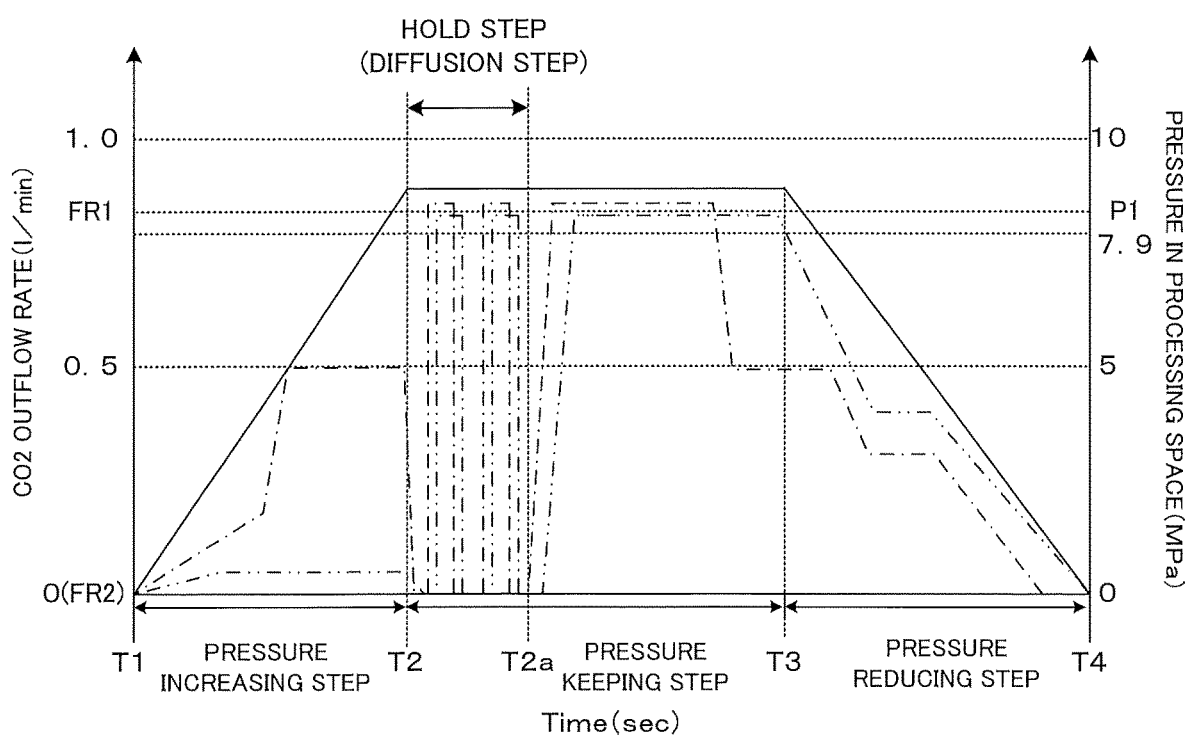

SUBSTRATE PROCESSING METHOD AND SUBSTRATE PROCESSING APPARATUS

CROSS REFERENCE TO RELATED APPLICATION

The disclosure of Japanese Patent Application No. 2021-142952 filed on Sep. 2, 2021 including specification, drawings and claims is incorporated herein by reference in its entirety.

BACKGROUND OF THE INVENTION

1. Field of the Invention

This invention relates to a substrate processing technique for processing a substrate by a processing fluid in a supercritical state in a processing space of a processing container.

2. Description of the Related Art

A processing process of various substrates such as semiconductor substrates and glass substrates for display device includes processing the surface of the substrate by various processing fluids. Processes using liquids such as chemical liquids and rinse liquids as the processing fluids have been conventionally widely performed. In recent years, processes using supercritical fluids have been also put to practice. Particularly, in a process of a substrate having a fine pattern formed on a surface, a supercritical fluid having a lower surface tension than a liquid enters deep into clearances of the pattern. Thus, the process can be efficiently performed and an occurrence risk of pattern collapse due to a surface tension during drying can be reduced.

For example, a substrate processing apparatus for drying a substrate using a supercritical fluid is described in JP 2018-082043A. In this apparatus, a wafer (substrate) placed on a holding plate in the form of a thin plate is carried into the inside (processing space) of the apparatus from one end part of the processing container, and carbon dioxide in a supercritical state is introduced into the processing container from another end part. Further, a fluid discharge header is provided in the processing container. A discharge port is connected to this fluid discharge header, and the supercritical fluid is discharged from the processing space to the outside of the processing container via the fluid discharge header and the discharge port.

SUMMARY OF INVENTION

Although not described in detail in JP 2018-082043A, after a substrate having a liquid adhering to a surface formed with a pattern is carried into the processing space of the processing container, a pressure increasing step, a pressure keeping step and a pressure reducing step are performed (described later with reference to FIG. 3). That is, $CO_2$ (carbon dioxide) serving as a processing fluid is supplied into the processing space, and a pressure of the processing fluid in the processing space is increased to a pressure at which a supercritical state can be maintained (pressure increasing step). By supplying the processing fluid into the processing space and discharging the processing fluid from the processing container via the fluid discharge header, a laminar flow of the processing fluid flowing substantially in parallel to the surface of the substrate is formed while the above pressure is maintained (pressure keeping step). After this pressure keeping step, a pressure reducing step is performed. By this series of steps, the substrate is dried.

However, in the prior art, the processing fluid and the liquid could not be sufficiently diffused with each other in the pressure keeping step, and a two-phase state of the processing fluid and the liquid remained between pattern elements as shown in field (a) of FIG. 5 in some cases. As a result, it has been difficult to effectively prevent a pattern collapse.

This invention was developed in view of the above problem and aims to provide a substrate processing method and a substrate processing apparatus capable of satisfactorily drying a substrate while effectively suppressing the collapse of a pattern formed on a surface of the substrate.

One aspect of the invention is a substrate processing method for drying a substrate using a processing fluid in a supercritical state while accommodating the substrate having a liquid adhered to a surface formed with a pattern in a processing space of a processing container, includes: (a) increasing a pressure in the processing space to a first pressure by supplying the processing fluid fed from a fluid supplier to the processing space, the supercritical state being reached at the first pressure; (b) flowing the processing fluid to the processing space at a first flow rate while maintaining the processing space at the first pressure by supplying the processing fluid to the processing space and discharging the processing fluid from the processing space, the processing space having been increased to the first pressure by the operation (a); (c) reducing the pressure in the processing space by discharging the processing fluid from the processing space, following the operation (b); and (d) performing mutual diffusion between the liquid and the processing fluid in the processing space by suppressing a flow rate of the processing fluid in the processing space to a second flow rate lower than the first flow rate while maintaining the processing space at the first pressure between the operation (a) and the operation (b) or in an initial stage of the operation (b).

Other aspect of the invention is a substrate processing apparatus, includes: a processing unit having a processing container and configured to dry a substrate using a processing fluid in a supercritical state while accommodating the substrate having a liquid adhered to a surface formed with a pattern in a processing space of the processing container: a fluid supplier configured to supply a processing fluid for a supercritical treatment to the processing space having the substrate accommodated therein; a fluid discharger configured to discharge the processing fluid from the processing space having the substrate accommodated therein; a fluid flow adjuster configured to adjust the supply of the processing fluid from the fluid supplier to the processing space and the discharge of the processing fluid from the processing space to the fluid discharger; and a controller configured to control the fluid flow adjuster to perform: a pressure increasing operation of increasing a pressure in the processing space to a first pressure by supplying the processing fluid to the processing space, the supercritical state being reached at the first pressure; a pressure keeping operation of causing the processing fluid to flow to the processing space at a first flow rate while maintaining the processing space at the first pressure by supplying the processing fluid to the processing space, the pressure of the processing space being increased to the first pressure, and discharging the processing fluid from the processing space; a pressure reducing operation of reducing the pressure in the processing space by discharging the processing fluid from the processing space, following the pressure keeping operation; and a diffusion operation of causing the liquid and the processing fluid to be mutually diffused in the processing space by suppressing a flow rate of the processing fluid in the processing space to a second flow rate lower than the first flow rate while maintaining the processing space at the first pressure between the pressure increasing operation and the pressure keeping operation or in an initial stage of the pressure keeping operation.

In the invention thus configured, the flow rate of the processing fluid in the processing space is suppressed to the second flow rate lower than the first flow rate while the pressure in the processing space is maintained at the first pressure immediately after the pressure in the processing space is increased to the first pressure at which the super-critical state is reached. In this way, the mutual diffusion between the processing fluid and the liquid in the processing space is promoted. After this diffusion proceeds, the sub-strate is dried by the discharge of the processing fluid from the processing space.

Effect of Invention

As described above, according to the invention, the sub-strate is dried by discharging the processing fluid from the processing space after the liquid and the processing fluid in the supercritical state are mutually diffused in the processing space. As a result, a pattern collapse can be effectively suppressed and the substrate can be satisfactorily dried.

All of a plurality of constituent elements of each aspect of the invention described above are not essential and some of the plurality of constituent elements can be appropriately changed, deleted, replaced by other new constituent ele-ments or have limited contents partially deleted in order to solve some or all of the aforementioned problems or to achieve some or all of effects described in this specification. Further, some or all of technical features included in one aspect of the invention described above can be combined with some or all of technical features included in another aspect of the invention described above to obtain one independent form of the invention in order to solve some or all of the aforementioned problems or to achieve some or all of the effects described in this specification.

BRIEF DESCRIPTION OF THE DRAWINGS

Figure 1:
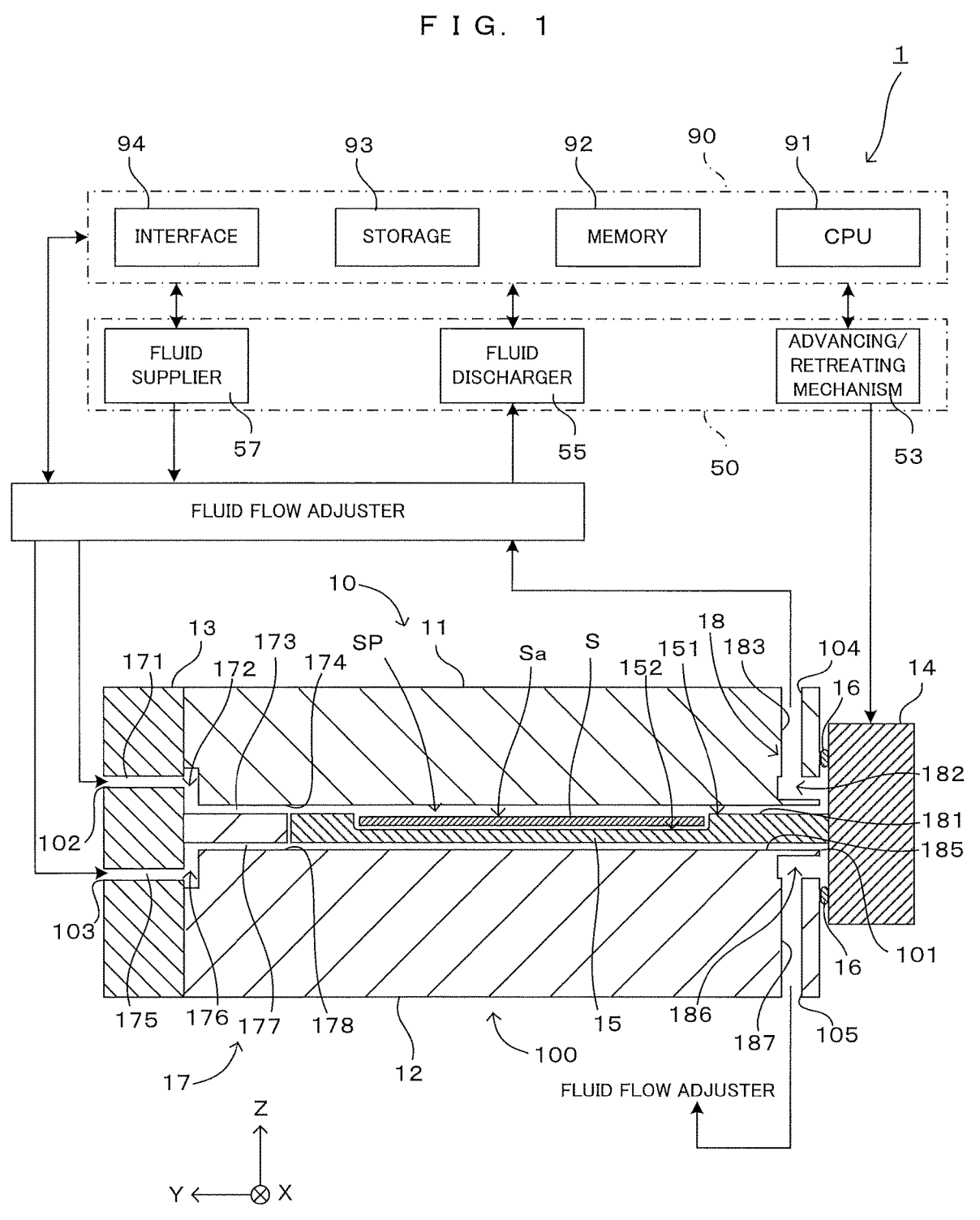

FIG. 1 is a view showing a schematic configuration of a substrate processing apparatus to which a first embodiment according to the invention is applicable.

FIGS. 2A and 2B are diagrams showing an example of the fluid flow adjuster equipped in the substrate processing apparatus.

FIG. 3 is a graph showing examples of changes of a $CO_2$ inflow rate and a $CO_2$ outflow rate and a pressure change in a processing space in the prior art.

FIG. 4 is a graph showing examples of changes of the $CO_2$ inflow rate and the $CO_2$ outflow rate and a pressure change in the processing space in the first embodiment of the substrate processing method according to the invention.

FIG. 5 is a diagram schematically showing a mixed state of the processing fluid and the liquid in the prior art and the first embodiment.

FIG. 6 is a graph showing examples of changes of the $CO_2$ inflow rate and the $CO_2$ outflow rate and a pressure change in the processing space in the second embodiment of the substrate processing method according to the invention.

FIG. 7 is a graph showing examples of changes of the $CO_2$ inflow rate and the $CO_2$ outflow rate and a pressure change in the processing space in the third embodiment of the substrate processing method according to the invention.

DETAILED DESCRIPTION OF THE PREFERRED EMBODIMENTS

FIG. 1 is a view showing a schematic configuration of a substrate processing apparatus to which a first embodiment according to the invention is applicable. This substrate processing apparatus 1 is an apparatus for processing sur-faces of various substrates such as semiconductor substrates using supercritical fluids. To show directions in each figure in a unified manner below, an XYZ orthogonal coordinate system is set as shown in FIG. 1. Here, an XY plane represents a horizontal plane and a Z direction represents a vertical direction. More specifically, a $(-Z)$ direction repre-sents a vertically downward direction.

Here, various substrates such as semiconductor wafers, glass substrates for photomask, glass substrates for liquid crystal display, glass substrates for plasma display, sub-strates for FED (Field Emission Display), substrates for optical disk, substrates for magnetic disk, substrates for magneto-optical disk can be adopted as the "substrate" in this embodiment. A substrate processing apparatus used to process a semiconductor wafer is mainly described as an example with reference to the drawings, but the substrate processing apparatus can be adopted also to process various substrates illustrated above.

The substrate processing apparatus 1 includes a process-ing unit 10, a supply unit 50, a fluid flow adjuster 70 and a control unit 90. The processing unit 10 serves as an execu-tion subject of a supercritical drying process, and the supply unit 50 supplies chemical substances and power necessary for the process to the processing unit 10. The fluid flow adjuster 70 is provided between the processing unit 10 and the supply unit 50, and regulates the supply of the fluid used for processing to the processing unit 10 and the discharge from the processing unit 10. The fluid flow adjuster 70 is provided between the processing unit 10 and the supply unit 50, and regulates the supply of the fluid used for processing to the processing unit 10 and the discharge from the pro-cessing unit 10.

The control unit 90 realizes a predetermined process by controlling these components of the apparatus. For this purpose, the control unit 90 includes a CPU 91 for executing various control programs, a memory 92 for temporarily storing processing data, a storage 93 for storing the control programs to be executed by the CPU 91, an interface 94 for information exchange with a user and an external apparatus, and the like. Operations of the apparatus to be described later are realized by the CPU 91 causing each component of the apparatus to perform a predetermined operation by executing the control program written in the storage 93 in advance.

The processing unit 10 includes a processing chamber 100. The processing chamber 100 includes a first member 11, a second member 12 and a third member 13 each formed by a metal block. The first and second members 11, 12 are vertically joined by an unillustrated joining member, and the third member 13 is joined to $(+Y)$ side surfaces of the first and second members 11, 12 by an unillustrated joining member, whereby the processing chamber 100 structured to be hollow inside is configured. This hollow internal space serves as a processing space SP in which the substrate S is processed. A substrate S to be processed is carried into the processing space SP to be processed. A slit-like opening 101 elongated in an X direction is formed in a $(-Y)$ side surface of the processing chamber 100, and the processing space SP communicates with an outside space via the opening 101.

A lid part 14 is provided on the (−Y) side surface of the processing chamber 100 to close the opening 101. A support tray 15 in the form of a flat plate is attached in a horizontal posture to a (+Y) side surface of the lid part 14, and the upper surface of the support tray 15 serves as a support surface on which the substrate S can be placed. More specifically, the support tray 15 is structured such that a recess 152 formed to be slightly larger than a planar size of the substrate S is provided in a substantially flat upper surface 151. The substrate S is accommodated into this recess 152, thereby being held at a predetermined position on the support tray 15. The substrate S is held with a surface Sa to be processed (hereinafter, may be simply referred to as a "substrate surface") faced up. At this time, the upper surface 151 of the support tray 15 and the substrate surface Sa are preferably coplanar.

The lid part 14 is supported horizontally movably in a Y direction by an unillustrated support mechanism. The lid part 14 is movable toward and away from the processing chamber 100 by an advancing/retreating mechanism 53 provided in the supply unit 50. Specifically, the advancing/retreating mechanism 53 includes a linear mechanism such as a linear motor, a linear guide, a ball-screw mechanism, a solenoid or an air cylinder, and such a linear mechanism moves the lid part 14 in the Y direction. The advancing/retreating mechanism 53 operates in response to a control command from the control unit 90.

If the support tray 15 is pulled out from the processing space SP to outside via the opening 101 by a movement of the lid part 14 in a (−Y) direction, the support tray 15 is accessible from outside. Specifically, it becomes possible to place the substrate S on the support tray 15 and take out the substrate S placed on the support tray 15. On the other hand, the lid part 14 moves in a (+Y) direction, whereby the support tray 15 is accommodated into the processing space SP. If the substrate S is placed on the support tray 15, the substrate S is carried into the processing space SP together with the support tray 15.

In the supercritical drying process mainly aimed to dry a substrate while preventing pattern collapse due to a surface tension of a liquid, the substrate S is carried in with the surface Sa covered by a liquid film to prevent the occurrence of pattern (reference sign PT in FIG. 5) collapse due to the exposed surface Sa. That is, the substrate S is carried into the processing space SP in a state where the liquid constituting the liquid film is attached to the surface Sa. An organic solvent having a relatively low surface tension such as isopropyl alcohol (IPA) or acetone can be preferably used as a liquid constituting the liquid film.

The lid part 14 moves in the (+Y) direction to close the opening 101, whereby the processing space SP is sealed. A sealing member 16 is provided between the (+Y) side surface of the lid part 14 and the (−Y) side surface of the processing chamber 100 to maintain an airtight state of the processing space SP. An annular member made of an elastic resin material such as rubber can be used as the sealing member 16. Further, the lid part 14 is fixed to the processing chamber 100 by an unillustrated lock mechanism. The substrate S is processed in the processing space SP with the airtight state of the processing space SP ensured in this way.

In this embodiment, a fluid of a substance usable for a supercritical process, e.g. carbon dioxide, is supplied in a gaseous or liquid state to the processing unit 10 from a fluid supplier 57 provided in the supply unit 50. Carbon dioxide enters a supercritical state at relatively low temperature and low pressure and is a chemical substance suitable for the supercritical drying process in having a property of dissolving an organic solvent often used in substrate processing well.

More specifically, the fluid supplier 57 outputs a fluid in a supercritical state or a fluid, which enters the supercritical state retroactively by being supplied in a gaseous or liquid state and having predetermined temperature and pressure applied thereto, as the processing fluid for processing the substrate S. For example, carbon dioxide in the gaseous or liquid state is output in a pressurized state. The fluid is fed under pressure to input ports 102, 103 provided in the (+Y) side surface of the processing chamber 100 via the fluid flow adjuster 70. That is, the fluid is fed from the fluid supplier 57 to the processing chamber 100 by operating in response to a control command from the control unit 90. The configurations and operations of the fluid flow adjuster 70 are described in detail later.

A flow passage 17 extending from the input ports 102, 103 to the processing space SP functions as an introduction flow passage for introducing the processing fluid ($CO_2$) supplied from the fluid supplier 57 to the processing space SP. Specifically, a flow passage 171 is connected to the input port 102. A buffer space 172 formed to suddenly enlarge a flow passage cross-sectional area is provided on an end part of the flow passage 171 opposite to the input port 102.

A flow passage 173 is further provided to connect the buffer space 172 and the processing space SP. The flow passage 173 has such a wide cross-sectional shape narrow in a vertical direction (Z direction) and long in a horizontal direction (X direction), and that cross-sectional shape is substantially constant in a flowing direction of the processing fluid. An end part of the flow passage 173 opposite to the buffer space 172 serves as a discharge opening 174 open to the processing space SP, and the processing fluid is introduced into the processing space SP through this discharge opening 174.

Desirably, a height of the flow passage 173 is equal to a distance between the ceiling surface of the processing space SP and the substrate surface Sa with the support tray 15 accommodated in the processing space SP. The discharge opening 174 is open to a gap between the ceiling surface of the processing space SP and the upper surface 151 of the support tray 15. For example, the ceiling surface of the flow passage 173 and the ceiling surface of the processing space SP can be coplanar. As just described, the discharge opening 174 is in the form of a slit elongated in the horizontal direction and facing the processing space SP.

Flow passages of the processing fluid are also similarly formed below the support tray 15. Specifically, a flow passage 175 is connected to the input port 103. A buffer space 176 formed to suddenly enlarge a flow passage cross-sectional area is provided on an end part of the flow passage 175 opposite to the input port 103.

The buffer space 176 and the processing space SP communicate via a flow passage 177. The flow passage 177 has such a wide cross-sectional shape narrow in the vertical direction (Z direction) and long in the horizontal direction (X direction), and that cross-sectional shape is substantially constant in the flowing direction of the processing fluid. An end part of the flow passage 177 opposite to the buffer space 176 serves as a discharge opening 178 open to the processing space SP, and the processing fluid is introduced into the processing space SP through this discharge opening 178.

Desirably, a height of the flow passage 177 is equal to a distance between the bottom surface of the processing space SP and the lower surface of the substrate S. The discharge opening 178 is open to a gap between the bottom surface of the processing space SP and the lower surface of the support tray 15. For example, the bottom surface of the flow passage 177 and the bottom surface of the processing space SP can be coplanar. That is, the discharge opening 178 is in the form of a slit elongated in the horizontal direction and facing the processing space SP.

In the Z direction, the flow passages 171 and 173 are desirably arranged at different positions. If the both flow passages are at the same height, part of the processing fluid having entered the buffer space 172 from the flow passage 171 directly flows straight to enter the flow passage 173. Then, a flow rate and a flow velocity of the processing fluid flowing into the flow passage 173 may be different at a position corresponding to the flow passage 171 and at other positions in a width direction of the flow passage orthogonal to the flowing direction, i.e. in the X direction. This makes the flow of the processing fluid flowing into the processing space SP from the flow passage 173 nonuniform in the X direction and causes a turbulence.

By arranging the flow passages 171, 173 at positions different in the Z direction, the processing fluid does not flow straight from the flow passage 171 to the flow passage 173 and the processing fluid can be introduced as a laminar flow uniform in the width direction into the processing space SP.

The processing fluid introduced from the introduction flow passage 17 is configured as just described flows along the upper and lower surfaces of the support tray 15 in the processing space SP and is discharged to the outside of the chamber (processing container) via an exhaust flow passage 18 configured as described below. The ceiling surface of the processing space SP and the upper surface 151 of the support tray 15 are both horizontal surfaces on a side closer to a (−Y) side than the substrate S, and the both surfaces are facing each other in parallel while keeping a constant gap. This gap functions as an upper flow passage 181 of exhaust flow passage 18 for introducing the processing fluid flowing along the upper surface 151 of the support tray 15 and the surface Sa of the substrate S into a discharge flow passage to be described later. That is, the upper flow passage 181 has such a wide cross-sectional shape narrow in the vertical direction (Z direction) and long in the horizontal direction (X direction).

An end part of the upstream region 181 opposite to the processing space SP is connected to a buffer space 182. Although a detailed structure is described later, the buffer space 182 is a space enclosed by the processing chamber 100, the lid member 14 and the sealing member 16. A width of the buffer space 182 in the X direction is equal to or larger than that of the upstream region 181, and a height of the buffer space 182 in the Z direction is larger than that of the upstream region 181. Therefore, the buffer space 182 has a larger flow passage cross-sectional area than the upstream region 181.

A downstream region 183 is connected to an upper part of the buffer space 182. The downstream region 183 is a through hole provided to penetrate through the first member 11, which is an upper block constituting the processing chamber 100. The upper end of the downstream region 183 constitutes an output port 104 open in the upper surface of the processing chamber 100, and the lower end thereof is open to face the buffer space 182.

As just described, in this embodiment, the exhaust flow passage 18 on an upper surface side of the support tray 15 has the following three regions, i.e.

The upstream region 181 formed between the upper surface 151 of the support tray 15 and the lower surface of the first member 11, The downstream region 183 connected to the fluid discharger 55, and An intermediate region (buffer space 182) allowing communication between the upstream region 181 and the downstream region 183.

Similarly, both the bottom surface of the processing space SP and the lower surface of the support tray 15 are horizontal flat surfaces, and the both are facing in parallel while keeping a constant gap. This gap functions as an upstream region 185 of the exhaust flow passage 18 for introducing the processing fluid flowing along the lower surface of the support tray 15 to the fluid discharger 55. Further, the upstream region 185 on a lower surface side of the support tray 15 is connected to a downstream region 187 via a buffer space 186 as on the upper surface side of the support tray 15. That is, the exhaust flow passage 18 on the lower surface side of the support tray 15 has the following three regions, i.e.

The upstream region 185 formed between the lower surface of the support tray 15 and the upper surface of the second member 12, The downstream region 187 connected to the fluid discharger 55, and An intermediate region (buffer space 186) allowing communication between the upstream region 185 and the downstream region 187.

The processing fluid flowing above the support tray 15 in the processing space SP is fed out to the output port 104 via the upstream region 181, the buffer space 182 and the downstream region 183. Similarly, the processing fluid flowing below the support tray 15 in the processing space SP is fed out to an output port 105 via the upstream region 185, the buffer space 186 and the downstream region 187. These output ports 104, 105 are connected to the fluid discharger 55 via a fluid flow adjuster 70 to be described in detail next. Thus, by the operation of the fluid flow adjuster 70 in response to a control command from the control unit 90, the processing fluid in the processing space SP is collected into the fluid discharger 55 via the fluid flow adjuster 70.

FIGS. 2A and 2B are diagrams showing an example of the fluid flow adjuster equipped in the substrate processing apparatus. FIG. 2A schematically shows the operation of each component of the processing unit 10 when a fresh processing fluid is fed into the processing unit 10 and the processing fluid used in the processing is collected from the processing unit 10. On the other hand, FIG. 2B schematically shows the operation of each component of the processing unit 10 when the processing fluid is caused to flow from the fluid supplier 57 to the fluid discharger 55 while detouring the processing unit 10. In FIGS. 2A and 2B, flow paths of the processing fluid are shown by dotted-line arrows. Further, in each symbol indicating a valve in FIGS. 2A and 2B, black triangular parts indicate a state where the valve is open and white triangular parts indicate a state where the valve is closed.

The fluid flow adjuster 70 includes pipes 71, 72 respectively connecting the fluid supplier 57 and the input ports 102, 103 and pipes 73, 74 respectively connecting the output ports 104, 105 and the fluid discharger 55.

A valve 751 and a filter 761 are successively disposed in the pipe 71 from the side of the fluid supplier 57 (left side in FIGS. 2A and 2B). Further, a valve 752, a filter 762 and an orifice 772 are successively disposed in the pipe 72 from the side of the fluid supplier 57. Thus, the valves 751, 752 are opened in response to a control command from the control unit 90, whereby the processing fluid is fed under pressure from the fluid supplier 57 to the processing space SP of the processing chamber 100. Moreover, in this embodiment, valve opening degrees of the valves 751, 752 can be switched in a multi-stage manner or continuously according to the above control command. Therefore, as described later, a flow rate of the processing fluid (hereinafter, referred to as a "$CO_2$ inflow rate") flowing into the processing space SP can be highly accurately adjusted by a valve opening degree adjustment.

Further, this embodiment is configured to cause the processing fluid separated on upper and lower sides to flow into the processing space SP. Thus, even if the valves 751, 752 are open at the same valve opening degree, a pressure difference may be created between the processing fluid flowing into via the input port 102 and the processing fluid flowing into the input port 103. Accordingly, in this embodiment, the pressure difference is suppressed or zeroed by providing the orifice 772 in the pipe 72 on a lower side. Of course, since the pressure difference is different depending on the configuration of the processing chamber 100 and a dimensional relationship of each component, orifice(s) may be provided only in the pipe 71, in the both pipes 71, 72 or in neither of these besides being provided only in the pipe 72. Further, if the number of the input ports increases, more various modes are considered. In short, in the case of supplying the processing fluid into the processing space SP from a plurality of input ports, it is desirable to consider the insertion of orifice(s) so that a pressure difference is not created between the input ports.

To control the discharge of the processing fluid supplied as described above from the processing space SP, a flowmeter 783 and a valve 753 are successively disposed in the pipe 73 from the side of the output port 104 (left side in FIGS. 2A and 2B). Similarly to the above, a flowmeter 782 and a valve 754 are also successively disposed in the pipe 74 from the side of the output port 105. Thus, the valves 753, 754 are opened in response to a control command from the control unit 90, whereby the processing fluid is collected from the processing space SP to the fluid discharger 55. Moreover, in this embodiment, valve opening degrees of the valves 753, 754 can also be switched in a multi-stage manner or continuously according to the above control command. Therefore, as described later, a flow rate of the processing fluid (hereinafter, referred to as a "$CO_2$ outflow rate") flowing out from the processing space SP can be highly accurately adjusted by a valve opening degree adjustment.

In this embodiment, the $CO_2$ inflow rate and $CO_2$ outflow rate described above can be respectively independently adjusted. Thus, as shown in FIGS. 3 and 4 to be described later, a pressure and a flow rate in the processing space SP of the processing chamber 100 can be variably controlled by the adjustment of the both rates.

On the other hand, the fluid flow adjuster 70 is provided with bypass pipes 791, 792 separated from and detouring the processing chamber 100. The bypass pipe 791 is branched from the pipe 71 on the side of the fluid supplier 57 (left side in FIGS. 2A and 2B) with respect to the valve 751, and joins the pipe 73 on the side of the fluid discharger 55 (right side in FIGS. 2A and 2B) with respect to the valve 753. The bypass pipe 792 is branched from the pipe 72 on the side of the fluid supplier 57 (left side in FIGS. 2A and 2B) with respect to the valve 752, and joins the pipe 74 on the side of the fluid discharger 55 (right side in FIGS. 2A and 2B) with respect to the valve 753. Valves 755, 756 are respectively disposed in these bypass pipes 791, 792. Thus, all the processing fluid fed from the fluid supplier 57 by opening the valves 755, 756 in response to a control command from the control unit 90 with the valves 751 to 754 closed flows to the fluid discharger 55 while detouring the processing chamber 100. That is, the supply of the processing fluid to the processing chamber 100 can be temporarily stopped with the fluid supplier 57 and the fluid discharger 55 kept in operation. Note that the valve opening degree may be made switchable in a multi-stage manner or continuously in response to the above control command also for the valves 755, 756. In this case, the $CO_2$ inflow rate, the $CO_2$ outflow rate and the amount of detoured $CO_2$ can be adjusted by appropriately controlling the valve opening degrees of the valves 751 to 756. A second embodiment to be described later utilizes such a property.

If the substrate S having a liquid (IPA in this embodiment) filled on the surface Sa is carried into the substrate processing apparatus 1 configured as described above by an unillustrated substrate conveying apparatus such as a conveyor robot, the lid member 14 moves in the (+Y) direction while supporting the substrate S. In this way, the substrate S is accommodated into the processing space SP together with the support tray 15, and the opening 101 is sealed by the lid member 14. Note that the valves 751 to 756 are all controlled to be closed during a substrate carry-in process.

Subsequent to that, a pressure increasing step, a pressure keeping step and a pressure reducing step are performed in this order. Particularly, in the first embodiment, an effect of suppressing a pattern collapse is enhanced by performing a hold step in an initial stage of the pressure keeping step. Here, a case where the substrate processing apparatus 1 is operated similarly to a conventional apparatus is first described with reference to FIGS. 2A and 3 to have a reason why these functions and effects are obtained in the first embodiment understood. Thereafter, the first embodiment of the invention is described in comparison to the prior art.

FIG. 3 is a graph showing examples of changes of a $CO_2$ inflow rate and a $CO_2$ outflow rate and a pressure change in a processing space in the prior art. If the substrate S accommodated in the processing space SP is processed in an operation sequence similar to that of the conventional apparatus in the substrate processing apparatus 1, the valves 755, 756 are constantly closed. Accordingly, a substrate processing is performed as follows by opening and closing the valves 751 to 754 and controlling valve opening degrees of these valves without the detour of the processing fluid via the bypass pipes 791, 792. In the conventional apparatus, a bypass system composed of the bypass pipes 791, 792 and the valves 755, 756 is unnecessary and a bypass system is not provided also in the apparatus described in JP 2018-082043A.

The control unit 90 switches the valves 751 to 754 from the closed state to the open state as shown in FIG. 2A to start the inflow of the processing fluid into the processing space SP and the outflow of the processing fluid from the processing space SP (timing T1) in a state where the fluid discharger 55 and the fluid supplier 57 are stably operating. That is, timing T1 means a start timing of the pressure increasing step.

The control unit 90 controls the valve opening degrees of the valves 751, 752 according to an elapsed time from the start (timing T1) of the pressure increasing step and controls the $CO_2$ inflow rate and the $CO_2$ outflow rate respectively in profiles shown by a one-dot chain line and a two-dot chain line. In this pressure increasing step, a control is executed to make the $CO_2$ inflow rate more than the $CO_2$ outflow rate, whereby the pressure in the processing space SP is linearly increased as indicated by a solid line of FIG. 3 and adjusted to reach a first pressure P1 higher than a critical pressure (about 7.9 MPa) of carbon dioxide at predetermined timing T2. In this way, the processing fluid in the processing space SP reaches a supercritical state. The pressure increasing step performed from timing T1 to timing T2 in this way corresponds to an example of a "pressure increasing operation".

Following the pressure increasing step, the control unit 90 controls the valve opening degrees of the valves 751 to 754 as follows (pressure keeping step) to maintain the pressure in the processing space SP at the first pressure P1, i.e. to perform the pressure keeping step. That is, the control unit 90 increases the $CO_2$ inflow rate and the $CO_2$ outflow rate only for a certain time as shown in FIG. 3. After the $CO_2$ inflow rate and the $CO_2$ outflow rate reach the same flow rate FR1, the control unit 90 adjusts the valve opening degrees of the valves 751 to 754 such that both the $CO_2$ inflow rate and the $CO_2$ outflow rate are the flow rate FR1 only for a certain time.

In a latter half of the pressure keeping step, the control unit 90 controls the valve opening degrees of the valves 751, 752 such that the $CO_2$ inflow rate starts decreasing. Then, the control unit 90 controls the valve opening degrees of the valves 753, 754 such that the $CO_2$ outflow rate starts decreasing at timing T3 reached upon the elapse of a certain time. In this way, the $CO_2$ outflow rate becomes more than the $CO_2$ inflow rate, the pressure keeping step is completed and the pressure in the processing space SP starts decreasing from the first pressure P1. That is, timing T3 corresponds to a start timing of the pressure reducing step.

In this pressure reducing step, the control unit 90 controls the valve opening degrees of the valves 751 to 754 such that the $CO_2$ inflow rate and the $CO_2$ outflow rate decrease (pressure reducing operation). In this way, the pressure in the processing space SP becomes lower than the first pressure P1. This pressure reducing step is continued until timing T4 at which the pressure in the processing space SP reaches zero.

As just described, in the conventional apparatus, the pressure increasing step, the pressure keeping step and the pressure reducing step are performed in this order by controlling the $CO_2$ inflow rate and the $CO_2$ outflow rate in the profiles shown in FIG. 3. Particularly, it is aimed in the pressure keeping step that the liquid is mixed with the processing fluid by the mutual diffusion between the processing fluid and the liquid. However, as described above, the processing fluid flows substantially in parallel to the surface Sa of the substrate S at the first flow rate FR1 and a laminar flow of the processing fluid is formed in the pressure keeping step. Thus, a two-phase state of the processing fluid ($CO_2$) and the liquid (IPA) might remain between the pattern elements PT, for example, as shown in field "Prior Art" of FIG. 5, and it could not necessarily be said that an effect of preventing the collapse of the pattern elements PT was sufficient.

In contrast, in the first embodiment, the flow of the processing fluid by way of the bypass pipes 791, 792, i.e. detour, is created in the initial stage of the pressure keeping step, whereby the flow rate of the processing fluid in the processing space SP is suppressed to a second flow rate FR2 lower than the first flow rate FR1. The first embodiment of the invention is described below with reference to FIGS. 2A, 2B and 4.

FIG. 4 is a graph showing examples of changes of the $CO_2$ inflow rate and the $CO_2$ outflow rate and a pressure change in the processing space in the first embodiment of the substrate processing method according to the invention. This first embodiment largely differs from the prior art shown in FIG. 3 in that a hold state in which a laminar flow of the processing fluid is not formed (or the flow rate is suppressed) is created in the initial stage of the pressure keeping step (timing T2 to timing T2*a*), and the other configuration is basically the same as in the prior art shown in FIG. 3. Therefore, the first embodiment is described in detail, centering on that point of difference.

In the first embodiment, the control unit 90 stops the supply of the processing fluid to the processing space SP and the discharge of the processing fluid from the processing space SP, following the pressure increasing step. More specifically, at timing T2, the control unit 90 switches the valves 751 to 754 from the open state to the closed state as shown in FIG. 2B. Simultaneously with that, the control unit 90 switches the valves 755, 756 from the closed state to the open state. Then, all of the processing fluid supplied from the fluid supplier 57 flows to the fluid discharger 55 via the bypass pipes 791, 792 and detours the processing space SP. This detouring state is continued only during the initial stage of the pressure keeping step (timing T2 to timing T2*a*) and, at timing T2*a*, the control unit 90 switches the valves 751 to 754 from the closed state to the open state and switches the valves 755, 756 from the open state to the closed state as shown in FIG. 2A. Thus, in the initial stage of the pressure keeping step, the processing fluid does not flow into the processing space SP and a laminar flow of the processing fluid is not formed as shown in FIG. 4. Moreover, the inside of the processing space SP is kept at the first pressure P1 and the processing fluid is maintained in the supercritical state. Therefore, in the processing space SP, the processing fluid and the liquid are mutually diffused and the processing fluid and the liquid are mixed with each other and a supercritical homogeneous phase is formed also between the pattern elements PT, for example, as schematically shown in field "First Embodiment" of FIG. 5.

The latter half of the pressure keeping step and the pressure reducing step are performed as in the prior art with the supercritical homogeneous phase, in which the processing fluid and the liquid are effectively mixed, formed.

As described above, according to the first embodiment, the flow rate of the processing fluid in the processing space SP is suppressed to the flow rate FR2 (=0) lower than the first flow rate FR1 immediately after the pressure in the processing space SP is increased to the first pressure P1 at which the supercritical state is reached. Thus, the mutual diffusion between the processing fluid and the liquid in the processing space SP can be promoted. After this diffusion proceeds, the processing fluid is discharged from the processing space SP. As a result, the pattern collapse can be effectively suppressed and the substrate can be satisfactorily dried as compared to the prior art.

Further, in the first embodiment, a bypass system including the bypass pipes 791, 792 and the valves 755, 756 is provided to set the second flow rate FR2 to zero. Thus, the $CO_2$ inflow rate can be suddenly changed by switching the detour to the bypass system and the cancellation of the detour while the processing fluid is being continuously supplied from the fluid supplier 57. That is, a hold step can be added while the fluid supplier 57 is stably caused to steadily operate.

Further, a hold time (=T2*a*–T2) during which the flow rate of the processing fluid in the processing space SP is maintained at the second flow rate FR2 can be appropriately selected according to a combination of the processing fluid and the liquid. If the processing fluid and the liquid are respectively "carbon dioxide" and "IPA", the hold time is preferably set in a range of 30 seconds or more and 45 seconds or less. This is because the mutual diffusion between the processing fluid and the liquid is insufficient if the hold time is less than 30 seconds and, conversely, the supply of the processing fluid regulated to a temperature suitable for the substrate processing to the processing space SP is stopped and, thus, it becomes difficult to maintain the supercritical state due to a temperature drop caused by heat dissipation from the processing chamber 100 if the hold exceeds 45 seconds. Note that a temperature regulator for regulating a temperature in the processing space SP may be added to set a longer hold time while preventing a temperature drop.

Further, the first pressure P1 can also be appropriately selected according to the combination of the processing fluid and the liquid, but it was confirmed by various experiments that the pattern collapse could be effectively prevented even if the first pressure P1 was set at a value lower than in the first embodiment (9.5 MPa), e.g. 8.5 MPa if the processing fluid and the liquid were respectively "carbon dioxide" and "IPA". However, since a supercritical pressure of a mixed phase of carbon dioxide and IPA is higher than a supercritical pressure (7.9 MPa) of carbon dioxide and approaches the above 8.5 MPa, a diffusion movement of the liquid (IPA) present between the pattern elements PT tends to be reduced. Therefore, the first pressure P1 is more preferably set at a value larger than 8.5 MPa.

As described above, in the first embodiment, the hold step corresponds to an example of a "performing mutual diffusion between the liquid and the processing fluid" of the invention, and the operation performed in the hold step corresponds to an example of an "operation (d)" and a "diffusion operation" of the invention. The processing chamber 100 corresponds to an example of a "processing container" of the invention. The control unit 90 corresponds to an example of a "controller" of the invention.

Note that the invention is not limited to the embodiment described above and various changes other than the aforementioned ones can be made without departing from the gist of the invention. For example, although the second flow rate FR2 of the processing fluid in the hold step is set to zero in the first embodiment, the $CO_2$ inflow rate may be set slightly higher than the $CO_2$ outflow rate and the second flow rate FR2 may be set to about 0.1 (1/min), for example, as shown in FIG. 6 (second embodiment). Of course, the value of the second flow rate FR2 is not limited to this. In short, part of the processing fluid fed from the fluid supplier 57 is fed to the processing space SP, whereas the remainder is discharged to the fluid discharger 55 by way of the bypass pipes 791, 792 separated from the processing chamber 100 and discharged from the processing space SP, whereby the second flow rate FR2 may be set to a value higher than zero and lower than the first flow rate FR1.

Further, in the first and second embodiments, the second flow rate FR2 is maintained constant in the hold step, which is an example of the "diffusion step" of the invention. However, for example, as shown in FIG. 7, a flow rate switching operation of switching the flow rate of the processing fluid in the processing space SP between the first flow rate FR1 and the second flow rate FR2 may be repeated in the hold step (third embodiment).

Further, although the diffusion step is performed in the initial stage of the pressure keeping step in the above embodiments, the diffusion step may be added between the pressure increasing step and the pressure keeping step.

Further, although the support tray 15 is mounted on the side surface of the lid member 14 and these integrally move in the above embodiments, there is no limitation to this. For example, a support tray may be configured to be movable independently of a lid member. In this case, the lid member may be a door-like member openably and closably mounted for an opening of a processing chamber.

Further, various chemical substances used in the processing of the above embodiments are some examples and various other chemical substances can be used instead if these chemical substances conform to the technical idea of the invention described above.

Although the invention has been described by way of the specific embodiment above, this description is not intended to be interpreted in a limited sense. Similar to other embodiments of the invention, various modifications of the disclosed embodiment will become more apparent to a person skilled in this art by referring to the description of the invention. Therefore, appended claims are construed to include these modifications or embodiments without departing from the true scope of the invention.

This invention can be applied to substrate processing techniques in general for processing a substrate by a processing fluid in a supercritical state in a processing space of a processing container.

What is claimed is:

1. A substrate processing method for drying a substrate using a processing fluid in a supercritical state while accommodating the substrate having a liquid adhered to a surface formed with a pattern in a processing space of a processing container, the method comprising:

(a) increasing a pressure in the processing space to a first pressure by supplying the processing fluid fed from a fluid supplier to the processing space, the supercritical state being reached at the first pressure;

(b) flowing the processing fluid to the processing space at a first flow rate while maintaining the processing space at the first pressure by supplying the processing fluid to the processing space and discharging the processing fluid from the processing space, the processing space having been increased to the first pressure by the increasing the pressure in the processing space;

(c) reducing the pressure in the processing space by discharging the processing fluid from the processing space, following the flowing the processing fluid to the processing space; and (d) performing mutual diffusion between the liquid and the processing fluid in the processing space by suppressing a flow rate of the processing fluid in the processing space to a second flow rate lower than the first flow rate while maintaining the processing space at the first pressure between the increasing the pressure in the processing space and the flowing the processing fluid to the processing space or in an initial stage of the flowing the processing fluid to the processing space.

2. The substrate processing method according to claim 1, wherein:

the flow rate of the processing fluid in the processing space is maintained at the second flow rate in the performing mutual diffusion.

3. The substrate processing method according to claim 1, wherein:

a flow rate switching operation of switching the flow rate of the processing fluid in the processing space between the first flow rate and the second flow rate is repeated in the performing mutual diffusion.

4. The substrate processing method according to claim 1, wherein:

the second flow rate is zeroed by discharging all of the processing fluid fed from the fluid supplier by way of a bypass pipe separated from the processing container in the performing mutual diffusion.

5. The substrate processing method according to claim 1, wherein:

the second flow rate is set to a value higher than zero and lower than the first flow rate by feeding part of the processing fluid fed from the fluid supplier to the processing space and, discharging a remainder of the processing fluid by way of a bypass pipe separated from the processing container and discharging the processing fluid from the processing space in the performing mutual diffusion.

6. The substrate processing method according to claim 1, wherein:

an execution time of the performing mutual diffusion is in a range of 30 seconds or more and 45 seconds or less.

7. The substrate processing method according to claim 1, wherein:

the processing fluid is carbon dioxide.

8. A substrate processing apparatus, comprising:

a processing unit having a processing container and configured to dry a substrate using a processing fluid in a supercritical state while accommodating the substrate having a liquid adhered to a surface formed with a pattern in a processing space of the processing container;

a fluid supplier configured to supply a processing fluid for a supercritical treatment to the processing space having the substrate accommodated therein;

a fluid discharger configured to discharge the processing fluid from the processing space having the substrate accommodated therein;

a fluid flow adjuster configured to adjust the supply of the processing fluid from the fluid supplier to the processing space and the discharge of the processing fluid from the processing space to the fluid discharger; and a controller configured to control the fluid flow adjuster to perform:

a pressure increasing operation of increasing a pressure in the processing space to a first pressure by supplying the processing fluid to the processing space, the supercritical state being reached at the first pressure;

a pressure keeping operation of causing the processing fluid to flow to the processing space at a first flow rate while maintaining the processing space at the first pressure by supplying the processing fluid to the processing space, the pressure of the processing space being increased to the first pressure, and discharging the processing fluid from the processing space;

a pressure reducing operation of reducing the pressure in the processing space by discharging the processing fluid from the processing space, following the pressure keeping operation; and a diffusion operation of causing the liquid and the processing fluid to be mutually diffused in the processing space by suppressing a flow rate of the processing fluid in the processing space to a second flow rate lower than the first flow rate while maintaining the processing space at the first pressure between the pressure increasing operation and the pressure keeping operation or in an initial stage of the pressure keeping operation.

9. The substrate processing apparatus according to claim 8, comprising a bypass pipe separated from the processing container and configured to directly feed the processing fluid supplied from the fluid supplier to the fluid discharger, wherein:

the controller is configured to adjust the flow rate of the processing fluid in the processing space by feeding all or part of the processing fluid supplied from the fluid supplier to the fluid discharger via the bypass pipe in the diffusion operation.

\* \* \* \* \*